United States Patent
Lym

(10) Patent No.: US 9,607,666 B2
(45) Date of Patent: Mar. 28, 2017

(54) INPUT/OUTPUT CIRCUIT AND INPUT/OUTPUT DEVICE INCLUDING THE SAME

(71) Applicant: SK hynix Inc., Icheon-si, Gyeonggi-do (KR)

(72) Inventor: Sangkug Lym, Seoul (KR)

(73) Assignee: SK HYNIX INC., Icheon-si (KR)

(*) Notice: Subject to any disclaimer, the term of this patent is extended or adjusted under 35 U.S.C. 154(b) by 0 days.

(21) Appl. No.: 14/934,570

(22) Filed: Nov. 6, 2015

(65) Prior Publication Data
US 2016/0372166 A1    Dec. 22, 2016

(30) Foreign Application Priority Data
Jun. 16, 2015 (KR) .................. 10-2015-0085293

(51) Int. Cl.
   *G11C 7/10* (2006.01)
   *G11C 8/10* (2006.01)
   *G11C 7/12* (2006.01)
(52) U.S. Cl.
   CPC .............. *G11C 7/10* (2013.01); *G11C 7/12* (2013.01); *G11C 8/10* (2013.01)
(58) Field of Classification Search
   CPC ....... G11C 7/1006; G11C 7/1051; G11C 8/12; G11C 7/18
   USPC ........................................ 365/189.02, 230.03
   See application file for complete search history.

(56) References Cited

U.S. PATENT DOCUMENTS

| 2003/0214866 A1* | 11/2003 | Kyung | G11C 7/1069 365/205 |
| 2008/0002478 A1 | 1/2008 | Park | |
| 2014/0050021 A1 | 2/2014 | Kim | |

FOREIGN PATENT DOCUMENTS

| KR | 100790446 B1 | 1/2008 |
| KR | 1020090024440 A | 3/2009 |
| KR | 1020140023748 A | 2/2014 |

OTHER PUBLICATIONS

Vivek Seshadri et al., "RowClone: Fast and Energy-Efficient In-DRAM Bulk Data Copy and Initialization", MICRO-46, Dec. 7-11, 2013, pp. 1-13, ACM.

* cited by examiner

*Primary Examiner* — Huan Hoang
(74) *Attorney, Agent, or Firm* — William Park & Associates Ltd.

(57) ABSTRACT

An input/output circuit according to an embodiment includes a plurality of memory cell units configured to independently perform output operations, each of the memory cell units including an input/output line, a selection circuit including a plurality of selection units, each selection unit setting a path to a global input/output line connected to each of the selection units, the number of the selection units being the same as the number of the memory cell units, the selection circuit selecting one of the plurality of memory cell units based on a path control signal and electrically connecting the input/output line of the selected memory cell unit to the global input/output lines of the plurality of selection units, and a plurality of input/output pad groups coupled to the global input/output lines.

17 Claims, 4 Drawing Sheets

INPUT/OUTPUT CIRCUIT AND INPUT/OUTPUT DEVICE INCLUDING THE SAME

CROSS-REFERENCE TO RELATED APPLICATION

The present application claims priority under 35 U.S.C. §119(a) to Korean application number 10-2015-0085293 filed on Jun. 16, 2015, in the Korean Intellectual Property Office, which is incorporated herein by reference in its entirety.

BACKGROUND

1. Technical Field

Various embodiments generally relate to an integrated circuit, and more particularly to an input/output circuit that may carry out input/output operations using a path selected from a variety of paths depending on an operation mode.

2. Related Art

A semiconductor device includes an input/output line for carrying out input/output operations by connecting the input/output line to a pad through a global input/output line. In addition to such a common input/output operations, the input/output line may be used for a row copy operation which allows row data to be copied somewhere else within a semiconductor device.

While the row copy operation is being performed within a semiconductor device, the row copy operation does not seem to be performed when it is viewed from outside of the semiconductor device. However, a memory cell may not be accessed through a global input/output line because the global input/output line is occupied by the row copy operation.

SUMMARY

In various embodiments, different memory cell units are selectively connected to global input/output lines provided in order to secure the paths of memory cell units included in a semiconductor device. Accordingly, although a global input/output line is occupied, such as the case where an input/output operation or a row copy operation is performed on a specific memory cell unit, access is possible through another global input/output line that has not been occupied.

Various embodiments are directed to the provision of an input/output device, which enables normal input/output operations to be performed although a row copy operation is performed from one bank to another bank if a semiconductor device includes a plurality of banks.

In an embodiment, an input/output circuit includes a plurality of memory cell units, a selection circuit and a plurality of input/output pad groups. The plurality of memory cell units independently performs output operations, and each of the memory cell units includes an input/output line. The selection circuit includes a plurality of selection units, each selection unit setting a path to a global input/output line connected to each of the selection units, the number of the selection unit is the same as the number of the memory cell units. The selection circuit selects one of the plurality of memory cell units based on a path control signal, and electrically connects the input/output line of the selected memory cell unit to the global input/output lines of the plurality of selection units. The plurality of input/output pad groups is coupled to the global input/output lines.

In an embodiment, an input/output device includes a first pad group and a second pad group configured to perform input/output operations between the input/output device and an external device and a plurality of banks including a first global input/output line and a second global input/output line respectively coupled to the first pad group and the second pad group. Furthermore, each of the plurality of banks includes first and second memory cell units and first and second selection units. The first and second memory cell units are capable of independently performing output operations and include first and second input/output lines. The first selection unit is configured to select one of the first input/output line of the first memory cell unit and the first input/output line of the second memory cell unit based on a first path control signal and provide the selected input/output line to the first global input/output line. The second selection unit is configured to select one of the second input/output line of the first memory cell unit and the second input/output line of the second memory cell unit based on a second path control signal and provide the selected input/output line to the second global input/output line.

DETAILED DESCRIPTION

Hereinafter, an input/output circuit and an input/output device will be described below with reference to the accompanying drawings through various examples of embodiments.

Figure 1:
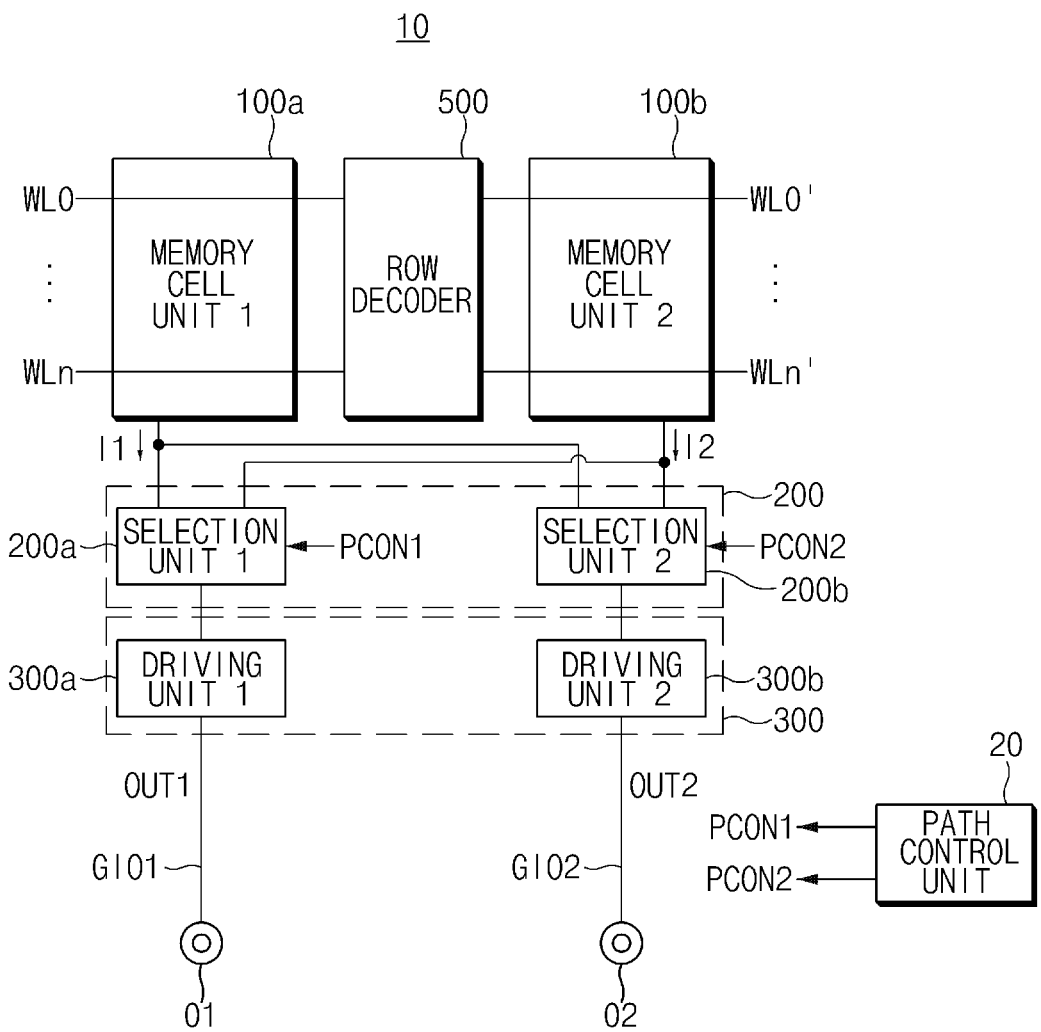
FIG. 1 is a diagram showing an input/output circuit in accordance with an embodiment.

FIG. 1 is a diagram showing an input/output circuit in accordance with an embodiment.

Referring to FIG. 1, the input/output circuit 10 may include a plurality of memory cell units 100a and 100b, a selection circuit 200 including a plurality of selection units 200a and 200b, and input/output pad groups O1 and O2.

The plurality of memory cell units 100a and 100b may independently perform output operations. Each memory cell unit 100a or 100b may include a group of input/output lines, and each group of input/output lines may perform an output operation for one of the memory cell units 100a and 100b. At least one of input/output lines included in the memory cell units 100a and 100b may be provided to one of the selection units 200a and 200b, respectively. For example, each of a first memory cell unit 100a and a second memory cell unit 100b may have input/output lines, and each of two input/output lines may be provided to one of the first and second selection units 200a and 200b.

Each of the memory cell units 100a and 100b may include a plurality of word lines, a plurality of bit lines crossing the word lines, and a plurality of memory cells coupled to the word lines and the bit lines.

Examples of the input/output lines of the memory cell units 100a and 100b may include bit lines coupled to memory cells.

The memory cell units 100a may share a first group of word lines WL0, ..., WLn. Likewise, the memory cell units 100b may share a second group of word lines WL0', ..., WLn'. The word lines WL0, ..., WLn and WL0', ..., WLn' may be coupled to the memory cell units 100a and 100b through a row decoder 500. Each word line may be distinguished based on row addresses.

For example, if the most significant bit (hereinafter referred to as "MSB") of a row address corresponds to a logic state 'high', the first memory cell unit 100a may be activated, and if the MSB of a row address corresponds to a logic state 'low', the second memory cell unit 100b may be activated.

The first memory cell unit 100a and the second memory cell unit 100b may form at least a part of a single memory bank. The first memory cell unit 100a and the second memory cell unit 100b may have the same number of input/output lines (e.g., bit lines).

The selection circuit 200 may include the first and second selection units 200a and 200b. For example, the input/output circuit 10 may include the number of selection units 200a and 200b same as the memory cell units 100a and 100b. FIG. 1 illustrates two memory cell units 100a and 100b and two selection units 200a and 200b, but the number of memory cell units and selection units is not limited thereto.

The selection units 200a and 200b set paths to global input/output lines GIO1 and GIO2 coupled thereto. Each selection unit 200a or 200b selects one of the plurality of memory cell units 100a and 100b based on a path control signal PCON1 or PCON2 and electrically connects the input/output line of the selected memory cell unit to one of the global input/output line GIO1 and GIO2.

In some embodiments, the first selection unit 200a may be coupled to the first memory cell unit 100a through an input/output line and to the second memory cell unit 100b through another input/output line. One of the two input/output lines that are coupled to the first selection unit 200a is selected to be coupled to the first global input/output line GIO1 based on the first path control signal PCON1.

Likewise, the second selection unit 200b may be coupled to the first memory cell unit 100a through an input/output line and to the second memory cell unit 100b through another input/output line. One of the two input/output lines that are coupled to the second selection unit 200b is selected to be coupled to the second global input/output line GIO2 based on the second path control signal PCON2.

Accordingly, while an input/output operation is performed through the first global input/output line GIO1, at least one of the first memory cell unit 100a and the second memory cell unit 100b may be accessed through the second global input/output line GIO2.

Input/output operations that the input/output circuit 10 carries out may vary depending on its operation modes. For instance, during a first operation mode, the first and second memory cell units 100a and 100b may perform their output operations at different timing from one another. During a second operation mode, the first and second memory cell units 100a and 100b may perform their output operations at the same timing as each other.

For example, the first operation mode may be called an "x4 operation mode," and the second operation mode may be called an "x8 operation mode."

If a first data signal I1 is outputted by the first memory cell unit 100a, and a second data signal I2 is outputted by the second memory cell unit 100b, the first and second global input/output lines GIO1 and GIO2 may have different output signals from each other depending on the operation mode as follows.

In the first operation mode, the first and second data signals I1 and I2 are not outputted at the same time. In an embodiment, the first and second data signals I1 and I2 may be sequentially outputted through a single global input/output line during the first operation mode. Accordingly, the first selection unit 200a sets a path so that the first and second data signals I1 and I2 are provided as a first output data signal OUT1 through the first global input/output line GIO1.

In some embodiments, a maximum size of data that can be outputted through a single global input/output line may be limited to a size of data that can be stored in a single memory cell unit 100a or 100b. Accordingly, the first selection unit 200a is electrically connected to the first memory cell unit 100a at one point of time so that the first data signal I1 is provided to the first global input/output line GIO1 and then electrically connected to the second memory cell unit 100b at the other point of time so that the second data signal I2 is provided to the first global input/output line GIO1. Here, the first output data signal OUT1 may include the first and second data signals I1 and I2.

In an embodiment, each of the first and second data signals I1 and I2 may be outputted when one of the memory cell units 100a and 100b is selected based on a row address.

The operation of the first selection unit 200a may be performed in response to the first path control signal PCON1. The first path control signal PCON1 may be generated by a path control unit 20.

As described above, during the first operation mode, the second global input/output line GIO2 is not used because the first and the second memory cell units 100a and 100b output the first and the second data signals I1 and I2 through the first global input/output line GIO1.

Accordingly, in some embodiments, while the first memory cell unit 100a is transmitting data signals through the first global input/output line GIO1, the second memory cell unit 100b can be accessed through the second global input/output line GIO2.

In the second operation mode, the plurality of memory cell units 100a and 100b may transmit, at the same time, the first data signal I1 and the second data signal I2 through the first global input/output line GIO1 and the second global input/output line GIO2, respectively. The first data signal I1 and the second data signal I2 outputted by the plurality of memory cell units 100a and 100b may not be transmitted through a single global input/output line at a time due to a capacity limit of the global input/output line.

The selection circuit 200 may electrically connect the input/output line of the first memory cell unit 100a to the first global input/output line GIO1 based on the path control signals PCON1 and PCON2 so that the first data signal I1 is transmitted as the first output data signal OUT1, and electrically connect the input/output line of the second memory cell unit 100b to the second global input/output line GIO2 based on the path control signals PCON1 and PCON2 so that the second data I2 is transmitted as the second output data signal OUT2.

In some embodiments, the input/output circuit 10 may further include driving units 300a and 300b. Each driving unit 300a or 300b may include a driving circuit coupled between the selection circuit 200 and pads O1 and O2. Each driving unit 300a or 300b may drive the data signals I1 and I2 read from the plurality of memory cell units 100a and 100b to generate the output data signals OUT1, OUT2.

The input/output circuit 10 according to an embodiment may further include the path control unit 20.

The path control unit 20 may generate the path control signals PCON1 and PCON2 based on operation modes and row addresses.

For example, the path control unit 20 may generate the path control signals PCON1 and PCON2 so that the output data signal OUT1 and OUT2 outputted through the respective global input/output lines GIO1 and GIO2 are as follows.

TABLE 1

| OPERATION MODE | ROW COPY | ROW ADDRESS MSB |
| --- | --- | --- |
| first operation mode (x4) | normal N | high H |
| second operation mode (x8) | row copy R | low L |

$$OUT1 = x4 \cdot N \cdot H \cdot I1 + x4 \cdot N \cdot L \cdot I2 + x8 \cdot I1$$

$$OUT2 = x4 \cdot R \cdot H \cdot I1 + x4 \cdot R \cdot L \cdot I2 + x8 \cdot I2$$

In a case where a normal input/output operation is performed during the first operation mode, the selection circuit 200 sets a path so that the memory cell units 100a and 100b are electrically connected to the first global input/output line GIO1 no matter which memory cell unit is selected through a row address.

Furthermore, if a row copy operation is to be performed during the first operation mode, the selection circuit 200 sets a path so that the memory cell units 100a and 100b are electrically connected to the second global input/output line GIO2 no matter which memory cell unit is selected. Accordingly, the path control unit 20 generates the path control signals PCON1 and PCON2 so that a memory cell unit performing a corresponding operation is connected to the second global input/output line GIO2.

In the first operation mode in which all of the global input/output lines do not need to be used at the same time, the input/output circuit 10 according to an embodiment sets paths so that the first global input/output line GIO1 and the second global input/output line GIO2 are separately controlled and used. For example, the input/output circuit 10 may perform a normal operation through the first global input/output line GIO1 and may perform a row copy operation through the second global input/output line GIO2 at the same time.

Accordingly, in the first operation mode, a row copy operation may be performed while a normal operation is performed.

Figure 2:
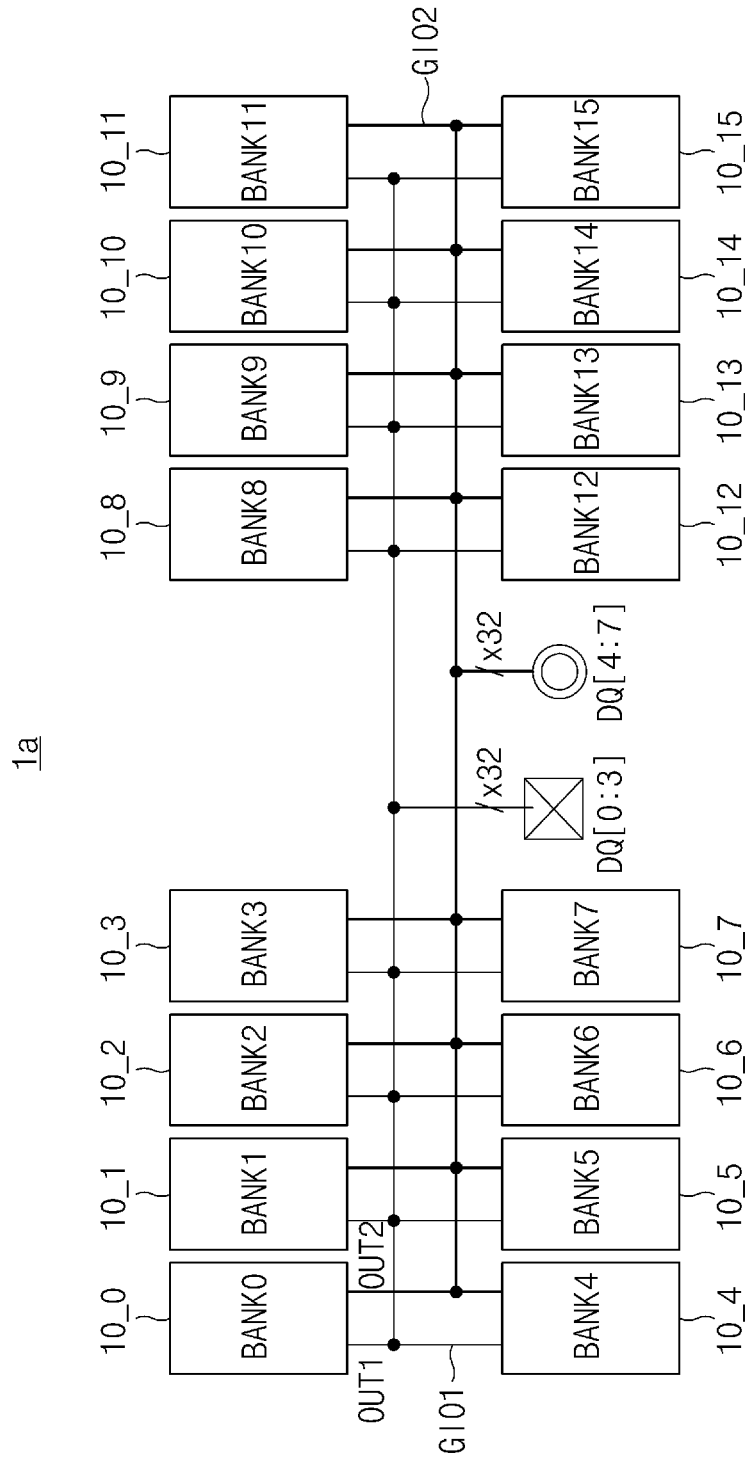
FIGS. 2 to 4 are diagrams showing an input/output device including the input/output circuit in accordance with an embodiment.
Figure 3:
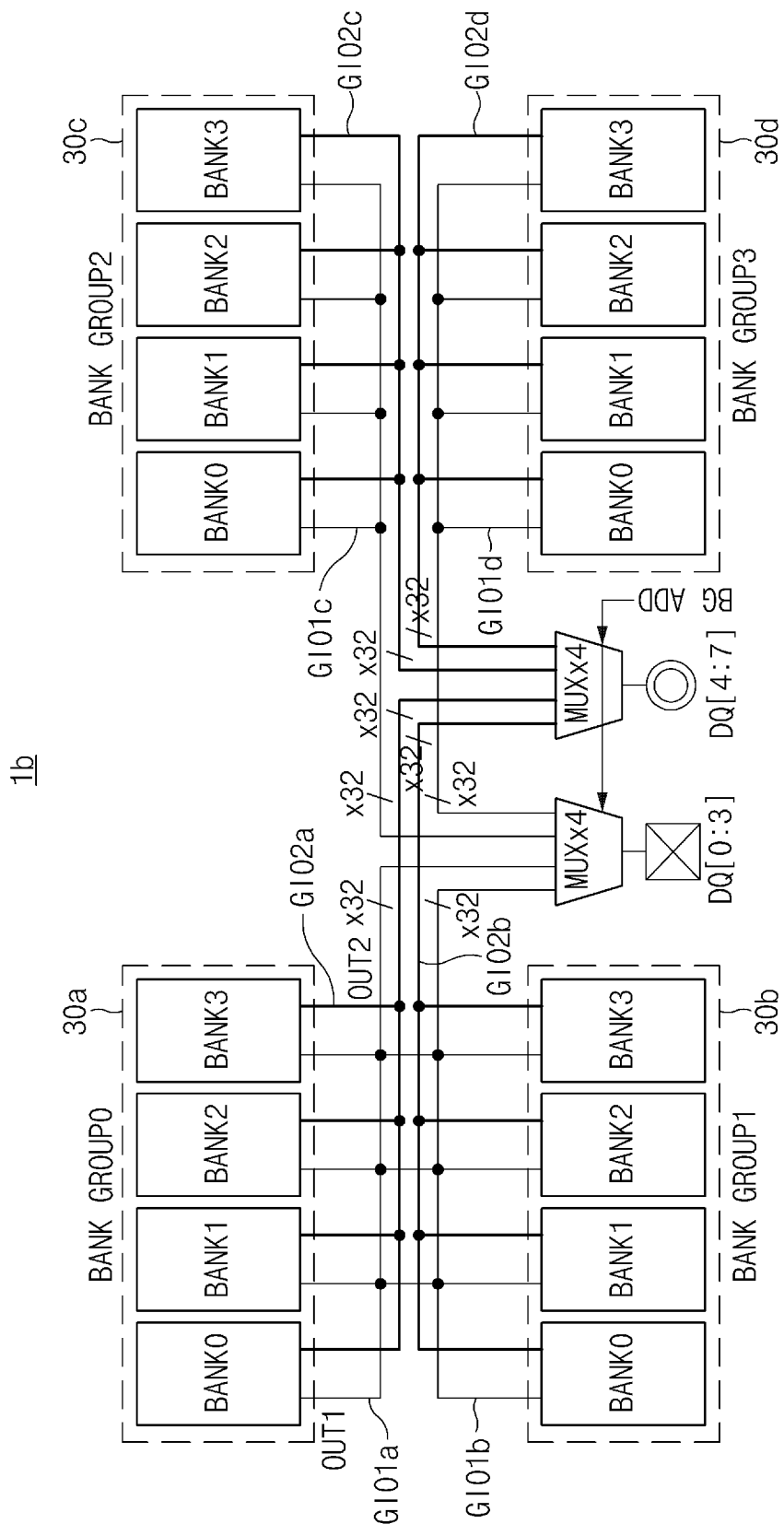
Figure 4:
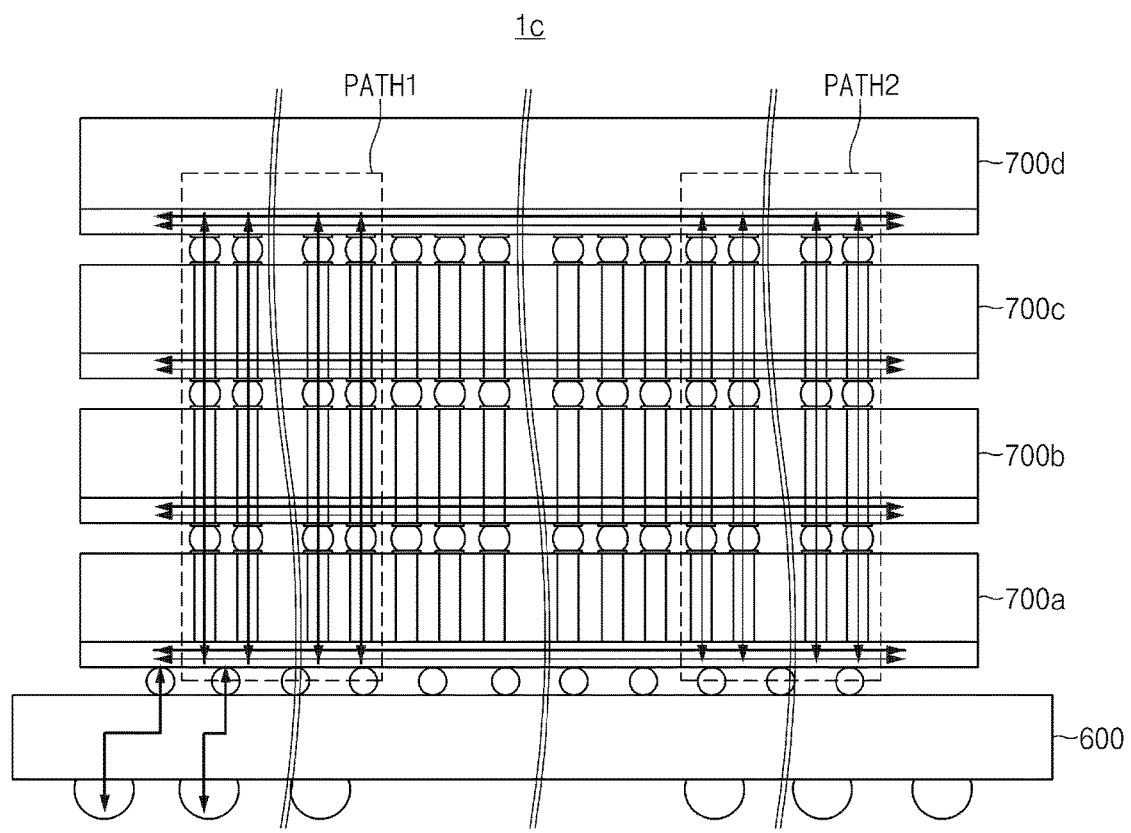

FIGS. 2 to 4 are diagrams showing an input/output device including a plurality of banks each including an input/output circuit in accordance with an embodiment.

Referring to FIG. 2, the input/output device 1a may include a plurality of banks 10_0, . . . , 10_15, a first pad group DQ[0:3], and a second pad group DQ[4:7]. The first pad group DQ[0:3], and the second pad group DQ[4:7] may perform input/output operations with respect to an external device. The input/output device 1a may also include first and second global input/output lines GIO1 and GIO2 coupled to the first and the second pad groups, respectively.

As described with reference to FIG. 1, in the first operation mode, each of the banks 10_0, . . . , 10_15 may include a selection circuit 200 that connects the input/output lines of the plurality of memory cell units 100a and 100b to the first global input/output line GIO1. Accordingly, while a normal operation is performed, each bank may perform a row copy operation through the second global input/output line GIO2 with respect to another bank.

In the second operation mode, the input/output device 1a performs a data input/output operation through the first and second global input/output line GIO1 and GIO2. In this case, a row copy operation is unable to be performed because all the global input/output lines GIO1 and GIO2 are occupied.

Although not shown, the input/output device 1a may further include the path control unit 20 shown in FIG. 1. The path control unit 20 may be included in each of the banks 10_1, . . . , 10_15 or may be implemented outside the bank.

If the path control unit 20 is implemented outside the banks, the path control unit 20 may generate a path control signal based on a bank address, a row address, and an operation mode.

FIG. 3 is a diagram showing an input/output device including a plurality of banks each including the input/output circuit according to an embodiment.

Referring to FIG. 3, an input/output device 1b may include a plurality of banks forming bank groups 30a, 30b, 30c, and 30d. The input/output device 1b may also include first and second groups of global input/output lines GIO1a, GIO2a, . . . , GIO1d, GIO2d that are connected to a first pad group DQ[0:3] and a second pad group DQ[4:7] through respective MUX circuits for each bank groups.

Likewise, each of the banks of the bank groups 30a, 30b, 30c, and 30d may include the input/output circuit 10 of FIG. 1. In this case, when a row copy operation is performed, a row copy operation may be performed only in a single bank group.

Each of the first and second MUX circuits may select a global input/output line coupled to one of the bank groups based on a bank group address signal BG ADD and may respectively output data signals to the first pad group DQ[0:3] and the second pad group DQ[4:7].

FIG. 4 is a diagram showing an input/output device including the input/output circuit according to an embodiment.

Referring to FIG. 4, the input/output device 1c may include a plurality of ranks 700a, . . . , 700d having the input/output circuits implemented therein and a substrate 600 in which the ranks are vertically stacked.

The ranks 700a, . . . , and 700d may be connected through a through via. In the input/output device 1c according to an embodiment, when a first operation mode is performed, all the first global input/output lines GIO1 performing a normal operation may be electrically connected through a first path PATH1. All the second global input/output lines GIO2 capable of performing a row copy operation during a first operation mode may be electrically connected through a second path PATH2. Here, the first and second paths PATH 1 and PATH2 may be formed of through vias.

As described above, the paths of the first and second global input/output lines GIO1 and GIO2 are coupled to each of the ranks 700a, . . . , 700d that are vertically stacked and electrically connected through the through via. Accordingly, a row copy operation can be performed while a normal operation is performed between the plurality of ranks 700a . . . , 700d.

As described above, in the input/output circuit and the input/output device according to various embodiments, the global input/output lines are physically separated with respect to a plurality of memory cell units forming a single bank, and paths formed between the memory cell units and the global input/output lines are controlled. Accordingly, if each memory cell unit may perform an output operation separately, a normal operation can be performed through only one global input/output line, and a different operation (e.g., row copy) can be performed through the other global input/output lines.

The memory cell units, therefore, may have improved accessibility to a global input/output line because it is controlled during a specific operation as described above.

Furthermore, the input/output circuit and the input/output device according to various embodiments enable a row copy operation that may be performed between various banks or ranks through a global input/output line.

The input/output circuit and the input/output device according to various embodiments include global input/output lines separated with respect to memory cell units that outputs data sequentially or at a time. Accordingly, the global input/output lines are selectively connected to the memory cell units depending on their operation mode. Accordingly, a memory cell unit may be accessed through the other global input/output line.

The input/output circuit and the input/output device according to various embodiments may improve accessibility to the memory cell units and efficiency thereof. In an embodiment, a row copy operation may be performed using dummy global input/output lines. For example, the second global input/output line may include a dummy global input/output line. In addition, a row copy operation may be performed using dummy pads.

While various embodiments have been described above, it will be understood to those skilled in the art that the embodiments described are by way of example only. Accordingly, the circuit and device described herein should not be limited based on the described embodiments.

What is claimed is:

1. An input/output circuit, comprising:
   a plurality of memory cell units configured to independently perform output operations, each of the memory cell units comprising an input/output line;
   a selection circuit comprising a plurality of selection units, each selection unit setting a path to a global input/output line connected to each of the selection units, the number of the selection units being the same as the number of the memory cell units, the selection circuit selecting one of the plurality of memory cell units based on a path control signal and electrically connecting the input/output line of the selected memory cell unit to the global input/output lines of the plurality of selection units; and
   a plurality of input/output pad groups coupled to the global input/output lines.

2. The input/output circuit of claim 1, wherein all of the input/output lines of the plurality of memory cell units are provided to the plurality of selection units.

3. The input/output circuit of claim 2, wherein:
   the memory cell units are configured to share a word line through a row decoder;
   each of the memory cell units has an identical number of input/output lines to each other; and
   each of the memory cell units is distinguished and selected based on a row address.

4. The input/output circuit of claim 3, wherein the memory cell units are configured to form a single memory bank.

5. The input/output circuit of claim 4, wherein, during a first operation mode, the memory units perform input/output operations at different timing from one another, and during a second operation mode, the memory units perform output operations at identical timing to one another.

6. The input/output circuit of claim 5, during the first operation mode, of the memory units is accessed, and data bits are copied from the selected memory unit to another memory unit.

7. The input/output circuit of claim 6, further comprising a path control unit configured to generate a path control signal based on the operation modes.

8. The input/output circuit of claim 7, further comprising driving units each coupled between the selection circuit and the input/output pad and configured to drive data read from each of the plurality of memory cell units.

9. An input/output device, comprising:
   a first pad group and a second pad group configured to perform input/output operations between the input/output device and an external device; and
   a plurality of banks comprising a first global input/output line and a second global input/output line respectively coupled to the first pad group and the second pad group,
   wherein each of the plurality of banks comprises:
   first and second memory cell units configured to independently perform output operations and comprise first and second input/output lines;
   a first selection unit configured to select one of the first input/output line of the first memory cell unit and the first input/output line of the second memory cell unit based on a first path control signal and provide the selected one of the first input/output lines to the first global input/output line; and
   a second selection unit configured to select one of the second input/output line of the first memory cell unit and the second input/output line of the second memory cell unit based on a second path control signal and provide the selected one of the second input/output lines to the second global input/output line.

10. The input/output device of claim 9, further comprising a path control unit configured to generate the first and the second path control signals.

11. The input/output device of claim 10, wherein the path control unit generates the first and the second path signals depending on whether a current operation is a first operation mode or a second operation mode, and wherein, during a first operation mode, the memory units perform input/output operations at different timing from one another, and during a second operation mode, the memory units perform output operations at identical timing to one another.

12. The input/output device of claim 11, wherein, in the first operation mode, the path control unit is configured to generate the first path control signal for selectively coupling the first input/output line of the first memory unit and the first input/output line of the second memory unit based on a row address signal and providing the selected input/output line to the first global input/output line.

13. The input/output device of claim 12, wherein, in the first operation mode, the path control unit is configured to generate the second path control signal so that the memory cell unit that has not been accessed is connected through the second global input/output line.

14. The input/output device of claim 11, wherein, in the second operation mode, the path control unit provides the first input/output line of the first memory unit to the first global input/output line and provide the second input/output line of the second memory unit to the second global input/output line.

15. The input/output device of claim 10, wherein the banks form one or more bank groups.

16. The input/output device of claim 15, further comprising:
   a first MUX circuit configured to select one of the first global input/output lines of the bank groups and output the selected first global input/output line to the first pad group; and
   a second MUX circuit configured to select one of the second global input/output lines of the bank groups and output the selected second global input/output line to the second pad group.

17. The input/output device of claim 15, wherein each of the bank groups comprises an identical number of banks.

\* \* \* \* \*